US010727161B2

(12) United States Patent
Smeys et al.

(10) Patent No.: US 10,727,161 B2
(45) Date of Patent: Jul. 28, 2020

(54) THERMAL AND STRESS ISOLATION FOR PRECISION CIRCUIT

(71) Applicant: Texas Instruments Incorporated, Dallas, TX (US)

(72) Inventors: Peter Smeys, San Jose, CA (US); Ting-Ta Yen, San Jose, CA (US); Barry Jon Male, West Granby, CT (US); Paul Merle Emerson, Madison, AL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/055,395

(22) Filed: Aug. 6, 2018

(65) Prior Publication Data
US 2020/0043828 A1    Feb. 6, 2020

(51) Int. Cl.
*H01L 23/433*  (2006.01)
*H01L 23/31*  (2006.01)
(Continued)

(52) U.S. Cl.
CPC ........ *H01L 23/4334* (2013.01); *H01L 23/315* (2013.01); *H01L 23/49541* (2013.01); *H01L 24/48* (2013.01); *H01L 24/49* (2013.01); *H01L 2224/32014* (2013.01); *H01L 2224/32245* (2013.01); *H01L 2224/48091* (2013.01);
(Continued)

(58) Field of Classification Search
CPC ........... H01L 23/4334; H01L 23/49541; H01L 23/315; H01L 24/49; H01L 29/48; H01L 2224/48091; H01L 2224/48247; H01L 2224/73265; H01L 2224/32245;
(Continued)

(56) References Cited

U.S. PATENT DOCUMENTS 4,007,978 A    2/1977 Holton
4,267,484 A    5/1981 O'Loughlin
(Continued)

FOREIGN PATENT DOCUMENTS

EP    1986297 A2    10/2008

OTHER PUBLICATIONS

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).
(Continued)

*Primary Examiner* — Sitaramarao S Yechuri
(74) *Attorney, Agent, or Firm* — Michael A. Davis, Jr.; Charles A. Brill; Frank D. Cimino

(57) ABSTRACT

Described examples include microelectronic devices and integrated circuits with an active first circuit in a first segment of a first wafer, a second circuit in a second segment of the first wafer, and second and third wafers bonded to different surfaces of the first wafer to provide first and second cavities with surfaces spaced from the first segment. An opening extends through the first wafer between the first and second cavities to separate portions of the first and second segments and to form a sealed cavity that surrounds the first segment. A bridge segment of the first wafer supports the first segment in the sealed cavity and includes one or more conductive structures to electrically connect the first and second circuits.

20 Claims, 11 Drawing Sheets

(51) Int. Cl.
*H01L 23/495* (2006.01)
*H01L 23/00* (2006.01)

(52) U.S. Cl.
CPC ............ *H01L 2224/48247* (2013.01); *H01L 2224/73265* (2013.01); *H01L 2924/06* (2013.01); *H01L 2924/10253* (2013.01); *H01L 2924/14* (2013.01)

(58) Field of Classification Search
CPC ....... H01L 2224/32014; H01L 2924/06; H01L 2924/10253; H01L 2924/14
See application file for complete search history.

(56) References Cited

U.S. PATENT DOCUMENTS

| | | | |
|---|---|---|---|
| 4,272,753 A | 6/1981 | Nicolay | |
| 5,389,578 A | 2/1995 | Hodson et al. | |
| 5,600,174 A * | 2/1997 | Reay | G01F 1/6845 257/401 |
| 5,929,514 A | 7/1999 | Yalamanchili | |
| 6,300,632 B1 * | 10/2001 | Liu | G01J 5/06 250/336.1 |
| 6,316,770 B1 * | 11/2001 | Ouvrier-Buffet | G01J 5/20 250/336.1 |
| 6,462,614 B2 * | 10/2002 | Yoon | G01F 1/6845 327/336 |
| 6,507,264 B1 | 1/2003 | Whitney | |
| 6,509,574 B2 | 1/2003 | Yuan et al. | |
| 6,648,503 B2 * | 11/2003 | Tanaka | G01J 5/20 250/338.1 |
| 6,977,468 B1 | 12/2005 | Baginski | |
| 7,015,587 B1 | 3/2006 | Poddar | |
| 7,180,064 B2 * | 2/2007 | Lee | B81B 7/0067 250/338.1 |
| 7,321,162 B1 | 1/2008 | Lee et al. | |
| 7,732,892 B2 | 6/2010 | Jeng et al. | |
| 7,842,542 B2 | 11/2010 | Shim et al. | |
| 7,869,180 B2 | 1/2011 | Cheung et al. | |
| 8,018,705 B2 | 9/2011 | Michalopoulos et al. | |
| 8,569,082 B2 | 10/2013 | Kummerl et al. | |
| 8,633,551 B1 | 1/2014 | Teh et al. | |
| 9,184,012 B2 | 11/2015 | Wang | |
| 9,419,075 B1 | 8/2016 | Carothers et al. | |
| 2004/0084729 A1 | 5/2004 | Leung et al. | |
| 2005/0170656 A1 * | 8/2005 | Nasiri | B81C 1/00238 438/700 |
| 2005/0179102 A1 * | 8/2005 | Weiblen | G01J 5/12 257/432 |
| 2006/0063462 A1 * | 3/2006 | Ding | B81B 7/0038 445/25 |
| 2008/0266730 A1 | 10/2008 | Viborg et al. | |
| 2009/0114901 A1 * | 5/2009 | Xie | B82Y 10/00 257/14 |
| 2010/0187652 A1 | 7/2010 | Yang | |
| 2011/0248374 A1 * | 10/2011 | Akin | G01J 5/20 257/470 |
| 2012/0142144 A1 * | 6/2012 | Taheri | B81B 7/007 438/107 |
| 2013/0001710 A1 * | 1/2013 | Daneman | H01L 23/10 257/415 |
| 2013/0168740 A1 * | 7/2013 | Chen | B81C 1/00238 257/254 |
| 2013/0329324 A1 | 12/2013 | Tziviskos et al. | |
| 2014/0084396 A1 * | 3/2014 | Jenkins | B81B 3/0021 257/419 |
| 2014/0273347 A1 * | 9/2014 | Tseng | H01L 21/76895 438/107 |
| 2015/0104895 A1 * | 4/2015 | Cheng | B81C 1/00293 438/51 |
| 2015/0175406 A1 * | 6/2015 | Lin | B81B 7/007 257/415 |
| 2015/0179861 A1 * | 6/2015 | Maes | G01J 5/02 257/467 |
| 2016/0029685 A1 * | 2/2016 | Tang | H05B 6/802 426/241 |
| 2016/0090297 A1 * | 3/2016 | Zhang | B81B 7/0048 257/417 |
| 2016/0149105 A1 * | 5/2016 | Van Buggenhout | H01L 27/144 257/429 |
| 2017/0022049 A1 * | 1/2017 | Chu | H01L 21/76898 |
| 2017/0275157 A1 * | 9/2017 | Zhu | B81C 1/0069 |
| 2019/0198487 A1 * | 6/2019 | Udrea | H01L 25/165 |

OTHER PUBLICATIONS

National Semiconductor Corporation, "Semiconductor Packaging Assembly Technology," National Semiconductor Corporation, Aug. 1999, pp. 1-8.
Cook, et al.: "Floating Die Package"; U.S. Appl. No. 15/248,151, filed Aug. 26, 2016; 34 pages.
Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).
Texas Instruments Product Brochure ISO7841x High-Performance, 8000-Vpk Reinforced Quad-Channel Digital Isolater, dated Nov. 2014 (37 pages).
Texas Instruments Application Report "The ISO72x Family of High-Speed Digital Isolators," SLLA198—Jan. 2006 (12 pages).
Texas Instruments Developers Guide "Digital Isolator Design Guide," SLLA284A, Jan. 2009 (19 pages).
Wikipedia article "3D Printing," retrieved from "http://en.wikipedia.org/w/index.php?title=3D_printing&oldid=624190184", dated Sep. 4, 2014 (35 pages).
OSRAM Opto Semiconductors GmbH, Olson Compact (850nm), version 1.6, SFH 4710, dated Dec. 1, 2015, 13pp.
Texas Instruments Product Brochure ISO7841x High-Performance, 8000-Vpk Reinforced Quad-Channel Digital Isolator, dated Nov. 2014 (37 pages).

* cited by examiner

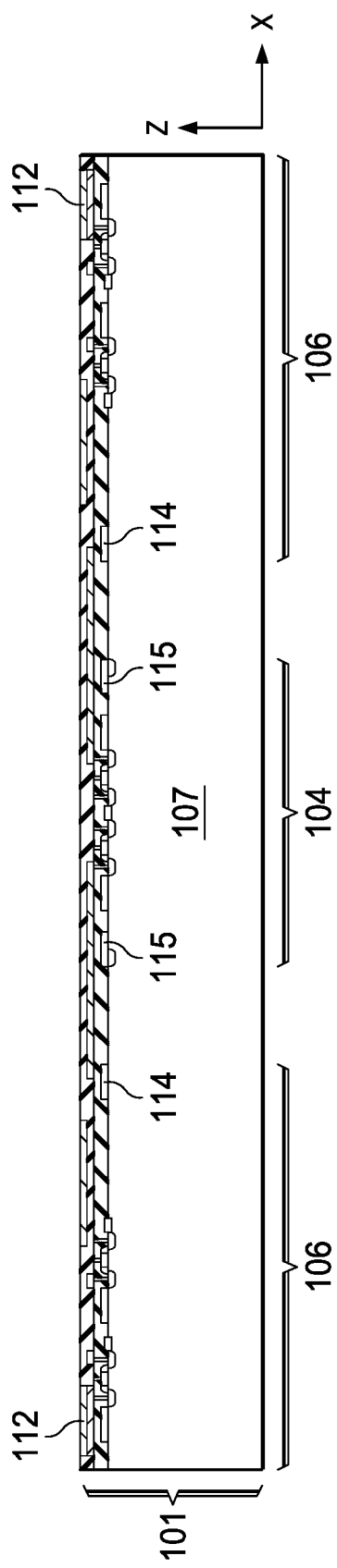
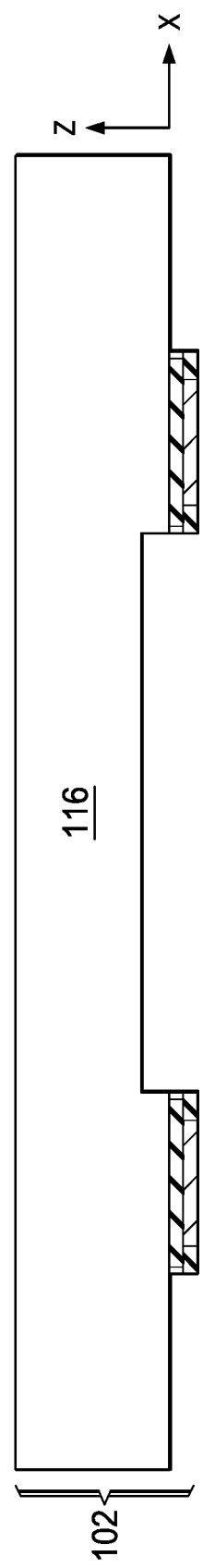

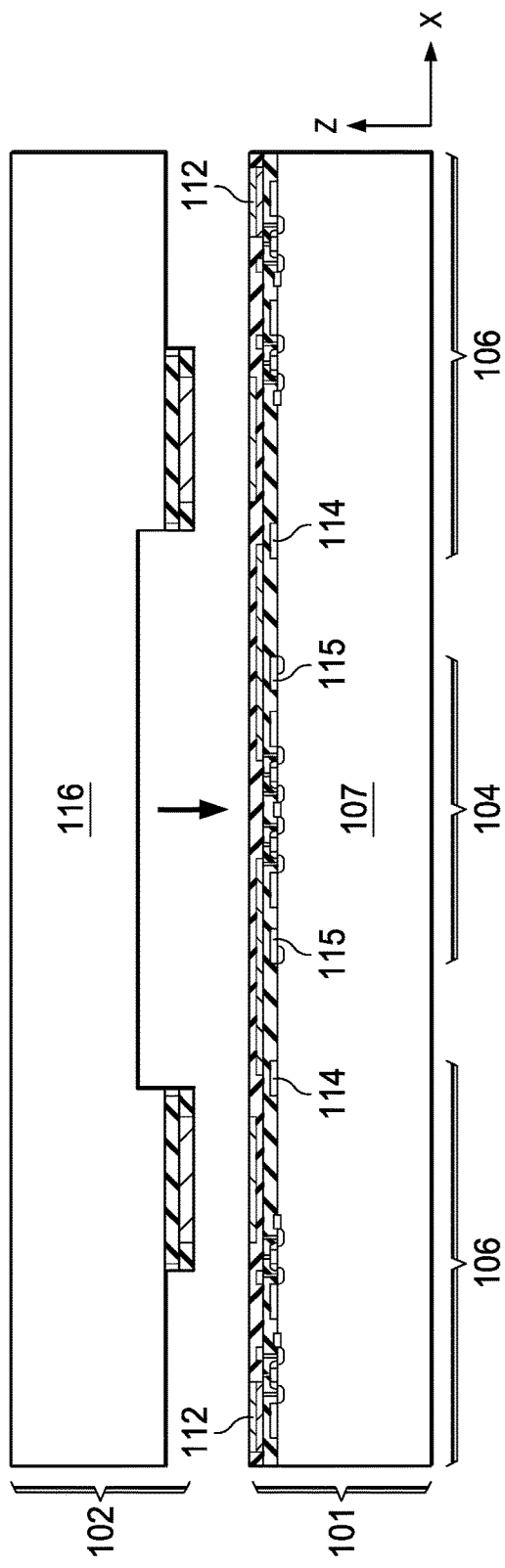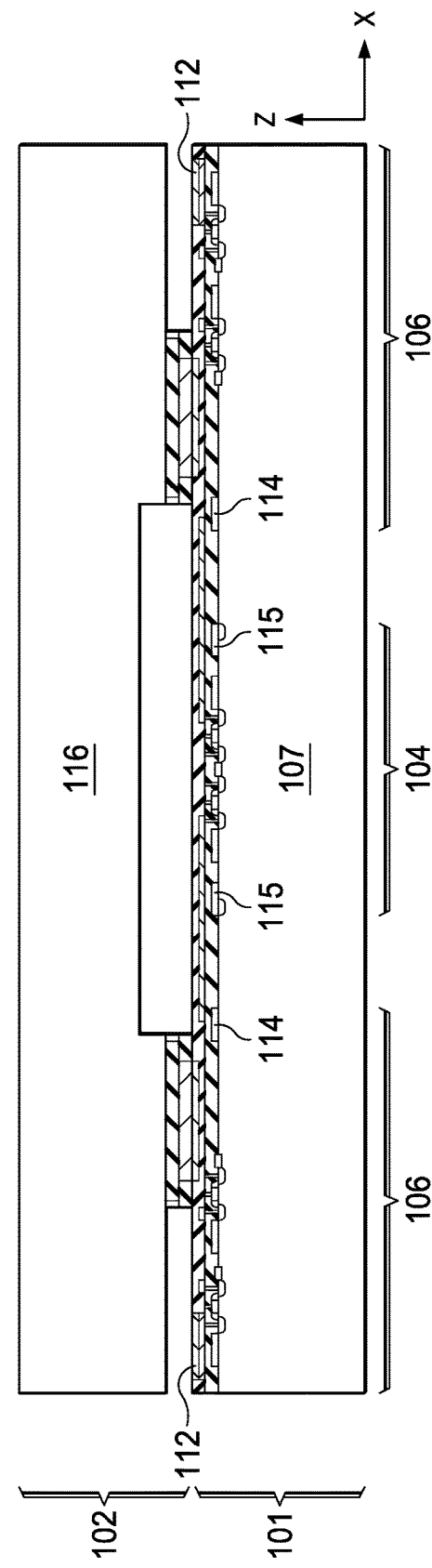

THERMAL AND STRESS ISOLATION FOR PRECISION CIRCUIT

BACKGROUND

Precision circuits such as voltage references, precision amplifiers, thermal sensor circuits, resonator circuits, clock circuits, analog to digital converters (ADCs) and digital to analog converters (DACs) are used in a variety of applications. The stability and performance of signals in precision circuitry can be impacted by external environmental factors such as package stress, board stress, thermal isolation or other thermal and/or mechanical stress. Low modulus of elasticity packaging materials can be used to enhance mechanical stress immunity, but these materials are costly and typically have a high coefficient of thermal expansion (CTE), and IC devices packaged in such material still suffer from parametric variation due to mechanical stress and/or temperature drift. Integrated heating or thermal transfer components can control the temperature of electrical components in an IC, alone or in combination with thermal insulation structures to facilitate component temperature stabilization, and ceramic packages can be used with soft die attach techniques to minimize mechanical vibration. However, these approaches are expensive and increase power consumption.

SUMMARY

Described examples include microelectronic devices, such as integrated circuits, and fabrication methods. An example includes an active first circuit in a first segment of a first wafer, and a second circuit in a second segment of the first wafer. Second and third wafers are bonded to different surfaces of the first wafer to provide first and second cavities with surfaces spaced from the first segment. An opening extends through the first wafer between the first and second cavities to separate portions of the first and second segments and to form a sealed cavity that surrounds the first segment. A bridge segment of the first wafer supports the first segment in the sealed cavity and includes one or more conductive structures to electrically connect the first and second circuits.

BRIEF DESCRIPTION OF THE DRAWINGS

FIG. 5 is a partial sectional side elevation view of a first wafer with first and second segments.

FIG. 6 is a partial sectional side elevation view of a second wafer with a cavity.

FIGS. 7 and 8 are partial sectional side elevation views of the first surface of the first wafer being bonded to a first surface of the second wafer.

DETAILED DESCRIPTION

Figure 1:
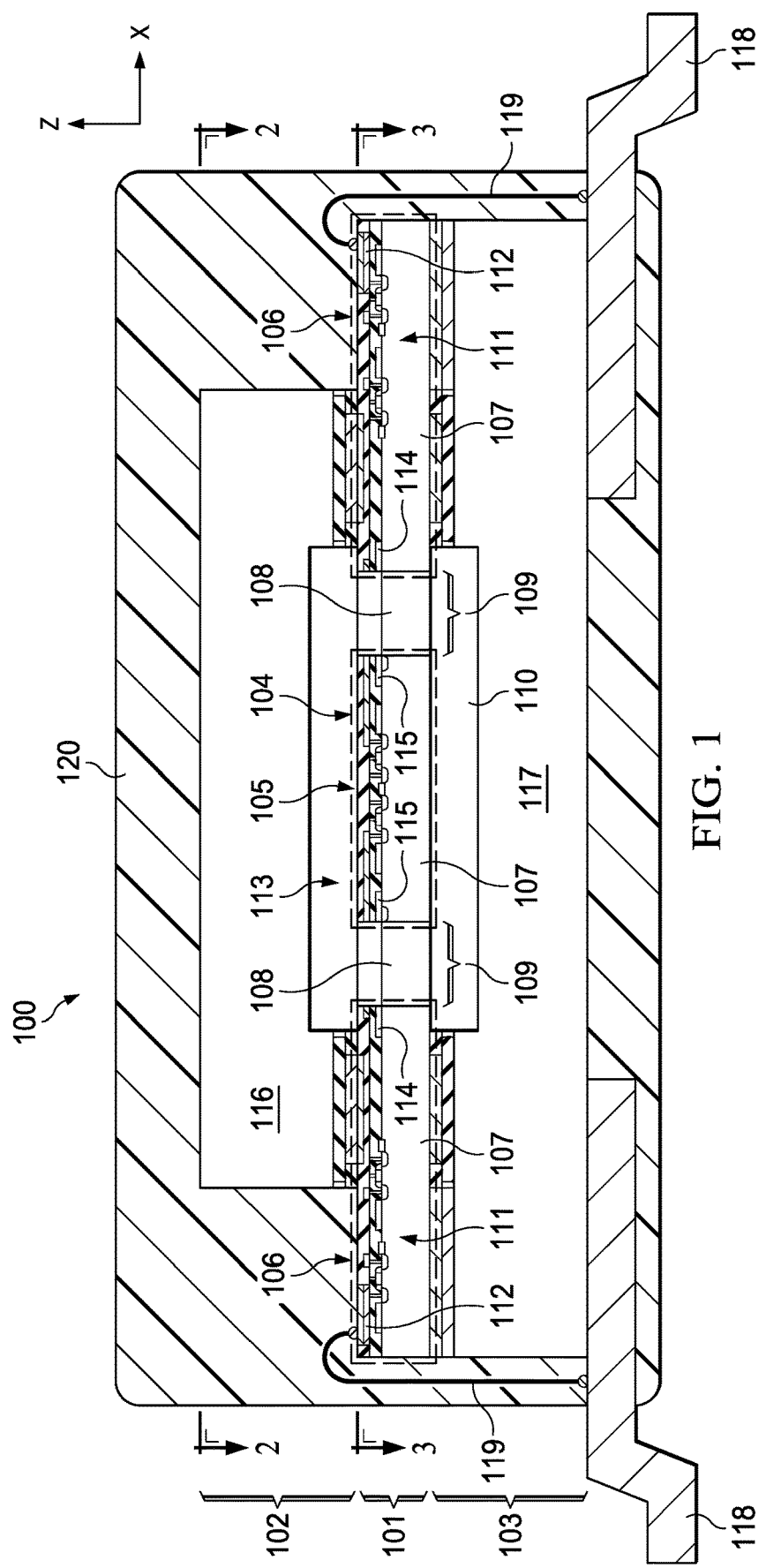
FIG. 1 is a sectional side elevation view of an example microelectronic device with a thermally and mechanically isolated precision circuit.

In the drawings, like reference numerals refer to like elements throughout, and the various features are not necessarily drawn to scale. In this description, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a microelectronic device 100, such as an integrated circuit (IC). The device 100 includes a first wafer 101, a second wafer 102 and a third wafer 103. The example first wafer 101 is segmented, and includes a first segment 104 with a first circuit 105, and a second segment 106. In one example, the wafer 101 includes a substrate 107, such as a p-type silicon wafer, a p-type silicon-on-insulator (SOI) substrate, or a substrate that includes a different semiconductor material. In some examples, the substrate 107 includes one or more epitaxial silicon layers (not shown).

The substrate 107 includes the first and second segments 104 and 106, and at least one bridge segment 108 that joins first portions of the first and second segments 104, 106 of the substrate 107. Also, the first wafer 101 includes at least one opening 109 that extends through the substrate 107 along the vertical (Z) direction from a first (e.g., top) surface of the first wafer 101 to a second (e.g., bottom) surface of the first wafer 101. The opening 109 forms a gap between second portions of the first and second segments 104, 106 of the substrate 107. The first segment 104 is supported by the bridge segment 108 within a sealed cavity 110 formed by the opening 109 of the first wafer 101 and spaced cavity surface portions of the second and third wafers 102 and 103. The second portion 106 includes a second circuit 111. The second portion 106 also includes a metallization structure with conductive contacts 112. As shown and described further below in connection with FIG. 3, the bridge segments 108 include conductive structures that electrically connect circuitry of the first and second portions 104, 106.

The first circuit 105 in the first segment 104 includes at least one active component 113. In one example, the first circuit 105 includes one or more transistors to form CMOS logic circuits, amplifier circuits, voltage reference circuits, temperature sensor circuitry, resonator circuits, clock circuits, analog to digital converter (ADC) circuits, digital-to-analog converter (DAC) circuits, etc. Locating the first segment 104 within the sealed cavity 110, and laterally separating the first and second segments 104, 106 by the opening 109 in the first wafer 107 facilitates thermal isolation of the first circuit 105 and the active component(s) 113 from the second portion 106 and the second circuit 111. In one example, the bridge segment 108 includes a portion of the first substrate 107 and a portion of a metallization structure formed on the first substrate 107, including one or more conductive structures that electrically interconnect the first and second circuits 105, 111. Accordingly, the only thermal connection between the first and second segments 104, 106 is through the bridge segment(s) 108.

In one example the bridge segment 108 has a thickness of a thickness of a patterned silicon (i.e., the thickness of the patterned die) plus the thickness of a metal interconnect on top. In another example, the bridge segment 108 has a thickness of a pattered silicon which, after a combination of etchings, results in a bridge segment thickness that is a fraction of the silicon die thickness plus the thickness of the metal interconnect on top. In another example, a thickness of the bridge segment 108 is only the thickness of the metal interconnect forming the bridge segment 108. In another example, a thickness of the bridge segment 108 is a thickness of a metal interconnect with polyimide. In one example, the thickness of the silicon of the bridge segment(s) 108 is the full thickness of the silicon of the first segment 104. In another example, the thickness of the silicon of the bridge segment(s) 108 is a partial silicon thickness resulting from selective etching. In another example, the bridge segment 108 includes only a portion of the metallization structure of the first wafer 101, and the underlying portion of the first substrate 107 is removed in the gap between the first and second segments 104, 106. In another example, the bridge segment 108 can include a polyimide material (not shown) and one or more conductive structures for electrical interconnection of the first and second circuits 105, 111, where the polyimide material provides good thermal insulation between the first circuit 105 and the remainder of the microelectronic device (e.g., IC) 100.

In one example, the device 100 includes one or more heating components to control a temperature of the first circuit 105 and/or to control a temperature of the sealed cavity 110. In the example of FIG. 1, the second circuit 111 includes a polysilicon resistor or other resistive component 114 formed in the second segment 106 alongside or proximate to a portion of the sealed cavity 110 (e.g., proximate the opening 109 through the first wafer 107), and the second circuit 111 includes an open or closed loop circuit (not shown) with an amplifier or other suitable circuitry that provides provide a controlled current to the resistive component 114 during operation of the device 100. Moreover, in the illustrated example, the first circuit 105 includes a resistive heating component 115, such as a poly silicon resistor or other resistive structure formed on or in the first segment 104 of the first substrate 107, to control the temperature of the first circuit 105 and/or to control the temperature of the sealed cavity 110. In this example, the first circuit 105 includes an open loop or closed loop circuit (not shown) with an amplifier or other suitable circuitry that provides provide a controlled current to the resistive component 114 during operation of the device 100. One or both of the circuits 105, 111 can include a thermal sensor component, such as a diode, a negative temperature coefficient (NTC) thermistor or a positive temperature coefficient (PTC) thermistor, to generate a feedback signal that represents the temperature of the first circuit 105, the temperature of the first segment 104 of the first wafer 101, and/or the temperature of the sealed cavity 110, and a reference circuit to provide a reference signal as a set point for comparison with the temperature feedback signal. The heating circuitry can include an amplifier, comparator, etc. to provide a controlled current to the included resistive heating components 114, 115, in order to control the temperature within the cavity 110.

The first wafer 101 is sandwiched between portions of the second and third wafers 102 and 103, respectively, in order to form the sealed cavity 110. In the example of FIG. 1, the second wafer 102 includes a substrate 116, such as a silicon substrate. In one example, the second wafer 102 includes a metallization structure formed on at least a portion of a first (e.g., lower) surface of the substrate 116. In another example, the second wafer 102 includes a bonding oxide material (not shown) formed on a portion of the first surface of the substrate 116. Moreover, in the example of FIG. 1, a cavity or concave portion is formed in the first surface of the substrate 116. In this example, the cavity of the substrate 116 provides spacing between the substrate 116 and the first portion 104 of the first wafer 101 to provide an upper portion of the sealed cavity 110 in the finished device structure 100. In the assembled device 100, the second wafer 102 includes the lower first surface, and an opposite second (e.g., top) surface spaced along the Z direction from the first surface. The first surface of the second wafer 102 includes: a first portion spaced along the first direction Z from the first segment 104 of the substrate 107; and a second portion bonded to the first surface of the first wafer 101. In the example of FIG. 1, the metallization structure of the second portion of the second wafer 102 is bonded to at least a portion of the metallization structure of the first wafer 101, leaving the first portion of the second wafer 10 to a from the top surface of the first segment 104 of the first wafer 101.

The third wafer 103 includes a substrate 117 (e.g., a silicon substrate), with a first (e.g., top) surface and a second (e.g., lower) surface that is spaced along the Z direction from the first surface. The first surface of the third wafer 103 includes: a first portion that is spaced along the Z direction from the first segment 104 of the substrate 107; and a second portion that is bonded to the second surface of the first wafer 101. In the illustrated example, the second portion of the first surface of the third wafer 103 includes a metallization structure that is bonded to the bottom surface of the first wafer 101. In another example, the bonded second portion of the first surface of the third wafer 103 includes a bonding oxide material (not shown) to facilitate wafer bonding with the first wafer 101. Moreover, in the illustrated example, the first portion of the first surface of the third wafer 103 includes a recessed or concave cavity that is spaced from the first segment 104 of the first wafer 101 to provide a bottom portion of the sealed cavity 110. In one example, the bond joint between the first wafer 101 and the second and third wafers 102, 103 is a metal-metal bonding between conductive portions of the corresponding metallization structures. Any suitable bonding processing can be used in other examples, such as eutectic, and adhesive bonding. The binding provides spaced regions between the upper and lower portions of the first segment 104 of the first wafer 101 and the upper and lower wafers 102 and 103. In the example of FIG. 1, the resulting sealed cavity 110 is defined by the opening 109, the first portion of the first surface of the second wafer 102, and the first portion of the first surface of the third wafer 103.

The conductive contacts 112 of the second segment 106 provide external connectivity for the first and second circuits 105 and 111. The microelectronic device 100 has integrated circuit package and features, including conductive leads 118 connected to respective ones of the conductive contacts 112 via bond wires 119. The conductive leads 118 extend partially outside a molded plastic package 120 that encloses the first wafer 101, the second wafer 102, and the third wafer 103. The use of molded plastic packaging material 120 provides a cost-effective packaging solution, and the thermal isolation aspects of the sealed cavity 110 and optional use of internal heating elements 114, 115 mitigate or avoid the need for more expensive packaging materials. The resulting microelectronic device 100 provides a thermally stabilized solution for precision circuitry 105 of the first segment 104. Also, the first segment 104 and the first circuit 105 are supported by the bridge segment or segments 108 to provide isolation from mechanical stresses during packaging and subsequent field use of the microelectronic device 100.

Figure 2:
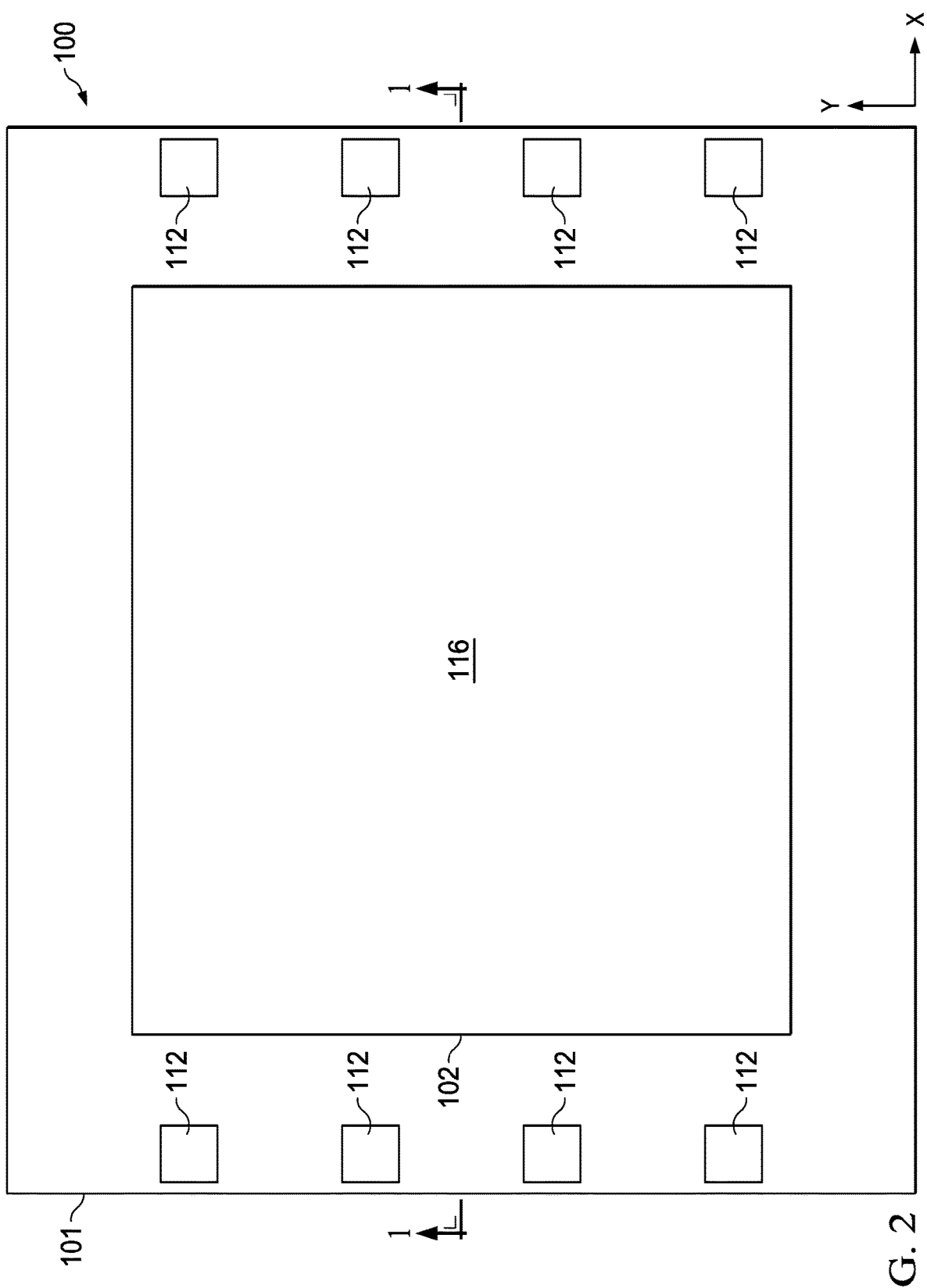
FIG. 2 is a top plan view of the microelectronic device taken along line 2-2 of FIG. 1.
Figure 3:
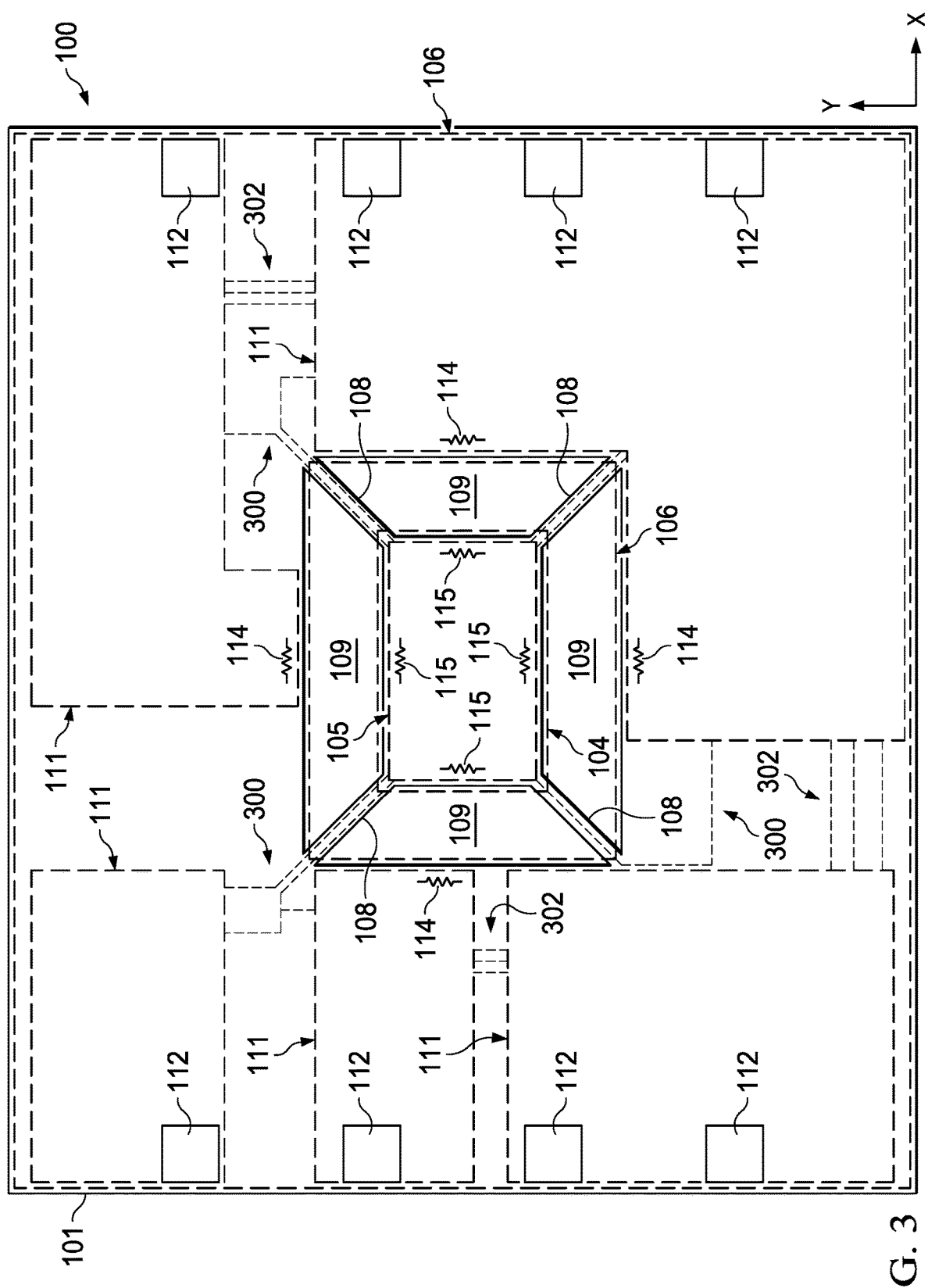
FIG. 3 is a sectional top view of the microelectronic device taken along line 3-3 of FIG. 1.

Referring also to FIGS. 2 and 3, FIG. 2 shows a sectional top view of the microelectronic device 100 taken along line 2-2 of FIG. 1, and FIG. 3 shows a sectional top view along line 3-3 of FIG. 1. As shown in the top view of FIG. 3, the first segment 104 has a generally rectangular profile or shape. In this example, the second segment 106 also has a generally rectangular outer perimeter in which several second circuits 111 are disposed. In this example, the second segment 106 of the substrate 107 laterally surrounds the first segment 104 in the X-Y plane of the substrate 107. Four example bridge segments 108 extend outward from the outer corners of the rectangular first segment 104 to the inner corners of the rectangular opening in the second segment 106. The bridge segments 108 join the first portions of the first and second segments 104, 106 of the substrate 107. The structure provides mechanical support for the first segment 104 relative to the laterally outward second segment 106. At least one of the bridge segments 108 also includes one or more conductive structures 300 shown in FIG. 3. In one example, the second segment 106 also includes conductive interconnect structures 302 that electrically connect the second circuits 106. In one implementation, the conductive structures 300 include metallization features of the bridge segment 108. In another implementation, the conductive structures 300 include conductive traces formed on a polyimide portion (not shown) of the bridge segment structures 108. In further implementations, the conductive structures 300 include one or more other suitable conductive features that electrically connect the first and second circuits 105 and 111 by which electrical signals are conveyed or delivered between the first circuit 105 and the second circuit 111, or combinations of the above.

The bridge structure or structures 108 support the first segment 104 of the substrate 107 relative to the second segment 106 of the substrate 107 within the sealed cavity 110 formed by the opening 109 of the first wafer 101, the first portion of the first surface of the second wafer 102, and the first portion of the first surface of the third wafer 103. As further described below in connection with FIGS. 14 and 15, different bridge segment types and forms can be used. The bridge structure 108 provides mechanical dampening to control or mitigate mechanical stress to the first circuit 105 of the first segment 104.

FIG. 3 shows a slight rectangular area that represents the first circuit 105. The first circuit 105 can be a variety of different circuit types that include one or more active components, such as a temperature sensor circuit, a resonator circuit, a clock circuit, a CMOS logic circuit, a voltage reference circuit, an amplifier circuit, an analog to digital converter circuit, and/or a digital to analog converter circuit. Moreover, in the illustrated example, the first circuit 105 includes the heating component 115 to control the temperature of the first circuit 105. In the example of FIG. 3, the optional heating circuit components 114 and 115 are shown schematically as resistors. The example support structure in FIGS. 1-3 facilitates thermal and mechanical stress isolation of the first circuit 105 without the shortcomings of other isolation approaches. Described examples provide complete stress decoupling and thermal isolation by suspending the active circuit 105 inside the hermetic cavity 110, in combination with a temperature controlled environment with thermal isolation and the possibility of embedded heaters via the heating elements 114 and/or 115. The described examples provide a wafer level packaging solution with the ability to achieve superior performance and standard plastic package structures 120 for integrated circuits that include multiple active components 113 and/or microelectronic devices 100 that include a single active component in the protected first circuit 105.

Figure 4:
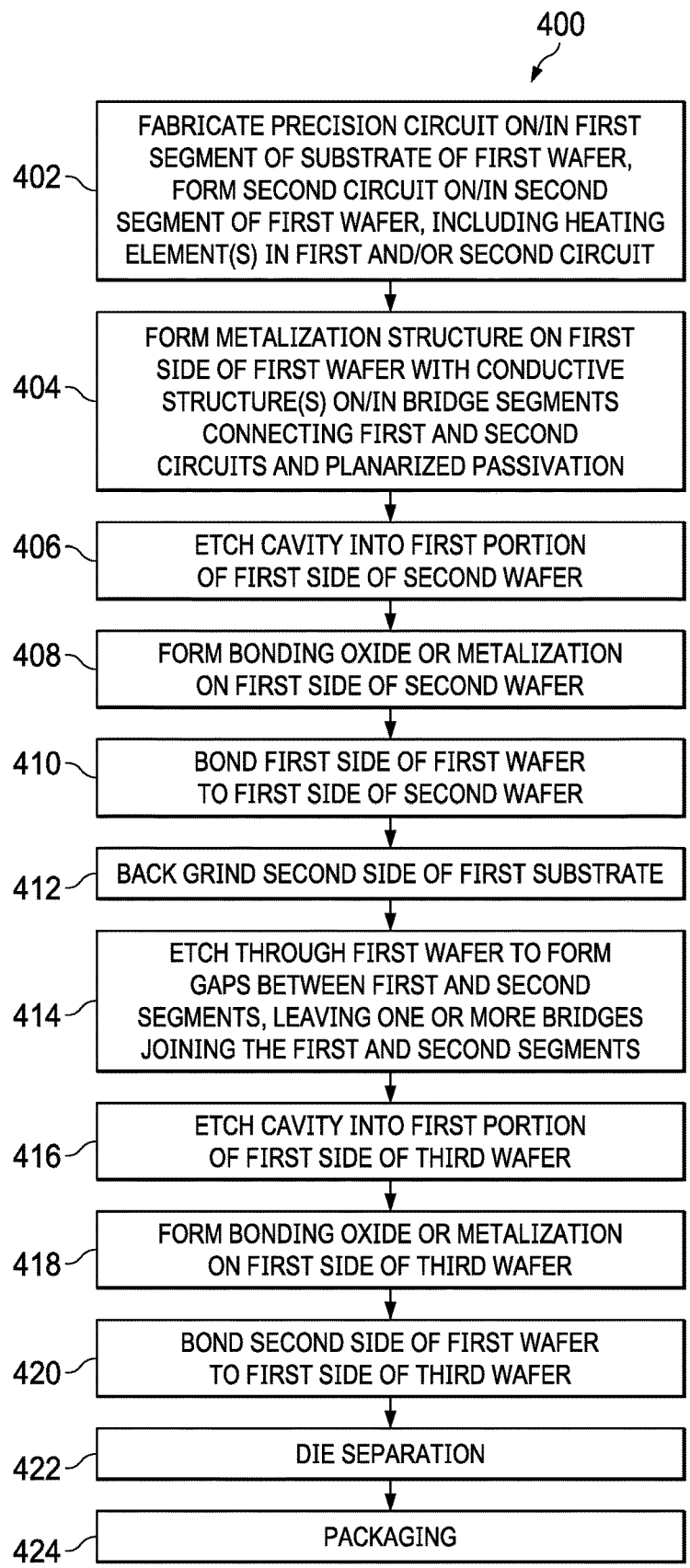
FIG. 4 is a flow diagram of a method of fabricating a microelectronic device.

FIG. 4 shows an example method 400 of fabricating a microelectronic device, such as the example microelectronic device 100. FIGS. 5-13 illustrate the device 100 at various intermediate stages of fabrication according to the method 400. The method 400 includes fabricating a first wafer 101 at 402 and 404. The method 400 begins with a first substrate (e.g., a silicon substrate 107 in FIG. 5). At 402, the method 200 includes forming a first circuit (e.g., 105) with one or more active components (e.g., 113) on and/or in a first segment (e.g., 104) of the first substrate 107. At 402, the method 400 also includes forming a second circuit (e.g., 111) in a second segment (e.g., 106 in FIG. 5) of the substrate 107. One implementation includes forming one or more heating components on and/or in the substrate 197 at 402, such as polysilicon resistors 114 in the first circuit 105 and/or polysilicon resistors 115 in the second circuit 111. The components of the first circuit 105 can be any combination of elements that form a temperature sensor circuit, a resonator circuit, a clock circuit, a CMOS logic circuit, a voltage reference circuit, an amplifier circuit, an analog to digital converter circuit, and/or a digital to analog converter circuit. The first circuit 105 includes one or more active components (113), such as transistors. In one example, the second circuit 111 includes auxiliary circuitry electrically connected to the first circuit 105 in subsequently formed metallization structures.

At 404, the method 400 further includes forming 404 a single or multilayer metallization structure on the substrate 107. In one example, the metallization structure processing at 404 includes forming one or more conductive structures (e.g., 300 in FIG. 3) formed over a bridge segment 108 of the substrate 107 to electrically connect the first and second circuits 105, 111, and forming interconnections (e.g., 302) between different second circuits 111 in the second segment 106. In one example, a passivation layer (not shown) is formed and planarized at 404 to provide a substantially planar top surface to the processed first wafer 107 as shown in FIG. 5.

Figure 9:
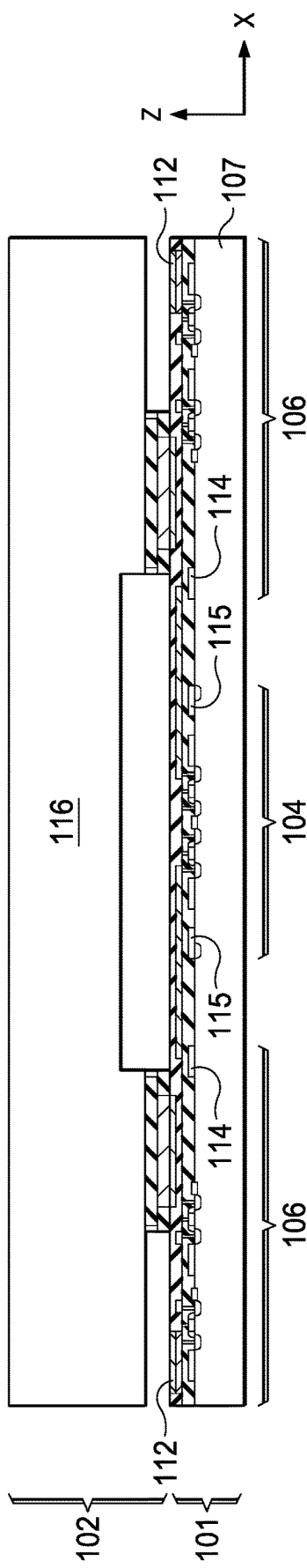
FIG. 9 is a partial sectional side elevation view of the first wafer after back grinding.

Referring to FIGS. 4 and 6-8, the method 400 also includes processing a second wafer (e.g., wafer 102). At 406, the method 400 includes forming a cavity or concave region in the second wafer 102. One example includes performing a selective etch process at 406, which etches a cavity into a first portion of a first surface of the second wafer 102. FIG. 6 shows one example, in which a cavity or recess is etched into the first (e.g., bottom) surface of the second substrate 116. At 408, the method 400 includes forming an oxide layer on the first surface of the second wafer 102 and/or forming a metallization structure on the first surface of the second wafer 102. FIG. 6 shows one example with a metallization structure formed on the first surface of the second wafer 102 laterally spaced from the etched cavity. As further shown in FIGS. 7 and 8, the method 400 further includes performing a wafer bonding process at 410, which bonds the first surface of the first wafer 101 to the first surface of the second wafer 102. The wafer bonding at 404 provides a structure as shown in FIG. 8 with the etched first portion of the second wafer 102 spaced from the first segment 104 of the substrate 107 to form an upper cavity. At 412, a back grind process is performed, which grinds the bottom surface of the first substrate 107 to provide a thin first wafer structure as shown in FIG. 9.

Figure 10:
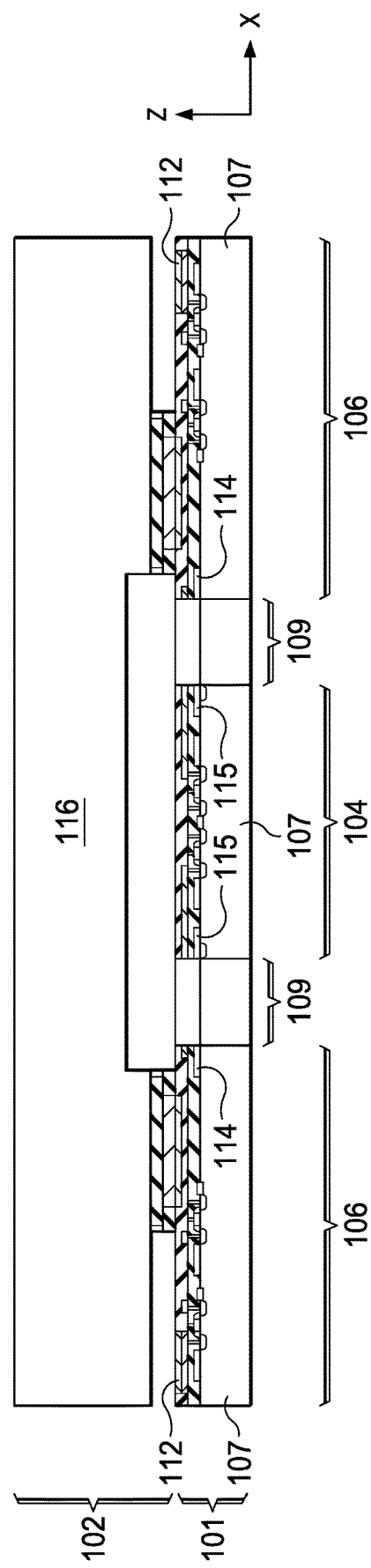
FIG. 10 is a partial sectional side elevation view of the first wafer after deep reactive ion etching.
Figure 14:
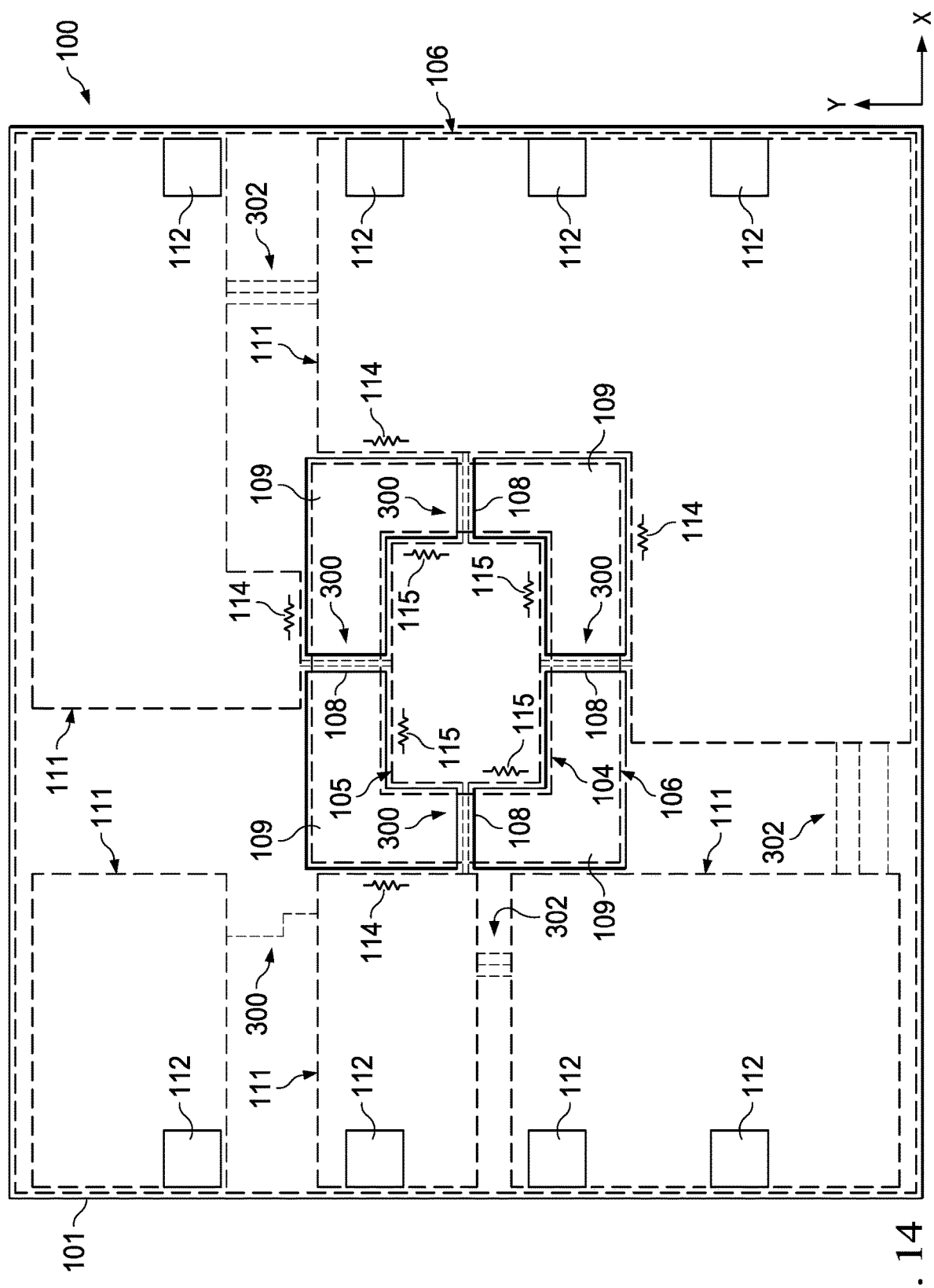
FIG. 14 is a sectional top view of another example microelectronic device taken along line 3-3 of FIG. 1.
Figure 15:
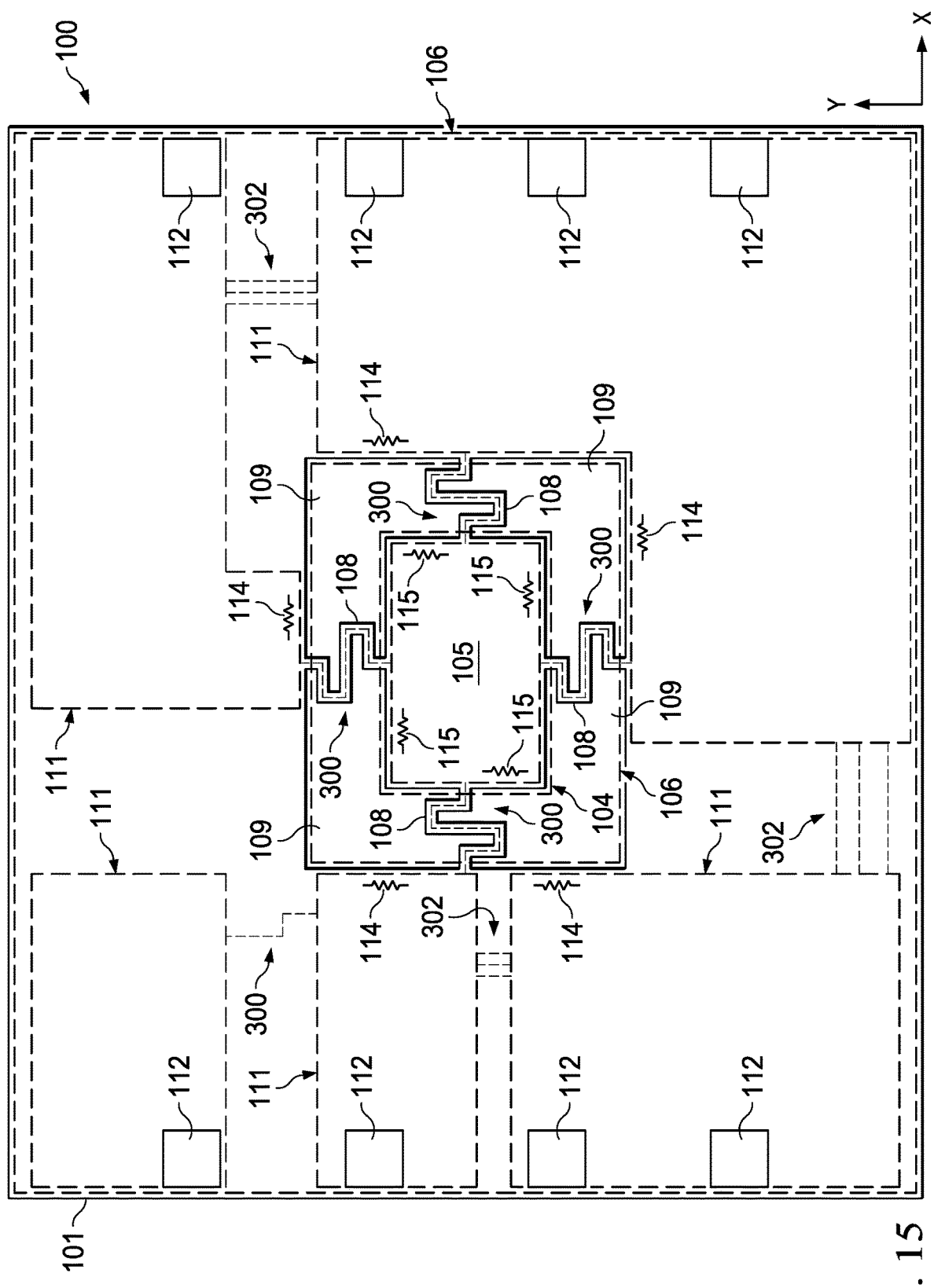
FIG. 15 is a sectional top view of another example microelectronic device taken along line 3-3 of FIG. 1.

At 414, the method 400 further includes performing a selective etch process, which forms one or more openings through the substrate 107, as shown in FIG. 10 (e.g., openings 109 in FIGS. 1 and 3). In one example, the etch process at 414 is a deep reactive ion etching (DRIE) process that forms the opening 109 through the substrate 107 and associated portions of the metallization structure. The etch process at 414 forms the opening(s) 109 through the substrate 107 along the Z direction from the first (e.g., top) surface of the first wafer 101 to the second surface (e.g., bottom) of the wafer 101 to form a gap between portions of the first and second segments 104, 106. In one example, the etching at 414 leaves one or more bridge segments 108 to support the first segment 104 with respect to the second segment 106. As shown in FIGS. 3, 14 and 15, different bridge segment types and forms can be used, which provide mechanical dampening to control or mitigate mechanical stress to the first circuit 105 of the first segment 104.

Figure 11:
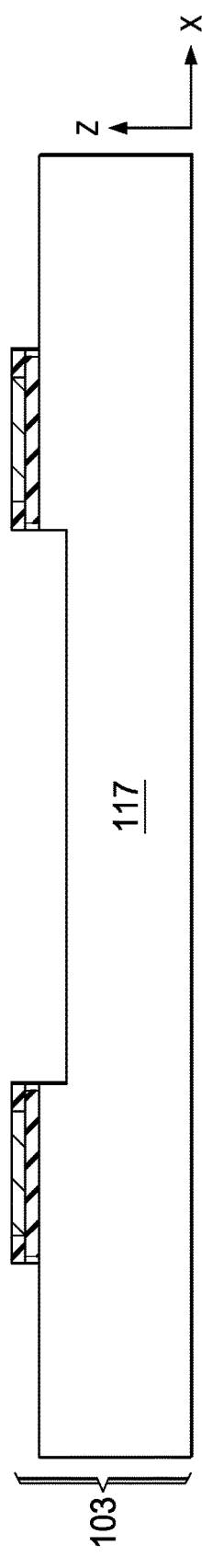
FIG. 11 is a partial sectional side elevation view of a third wafer with a cavity.
Figure 12:
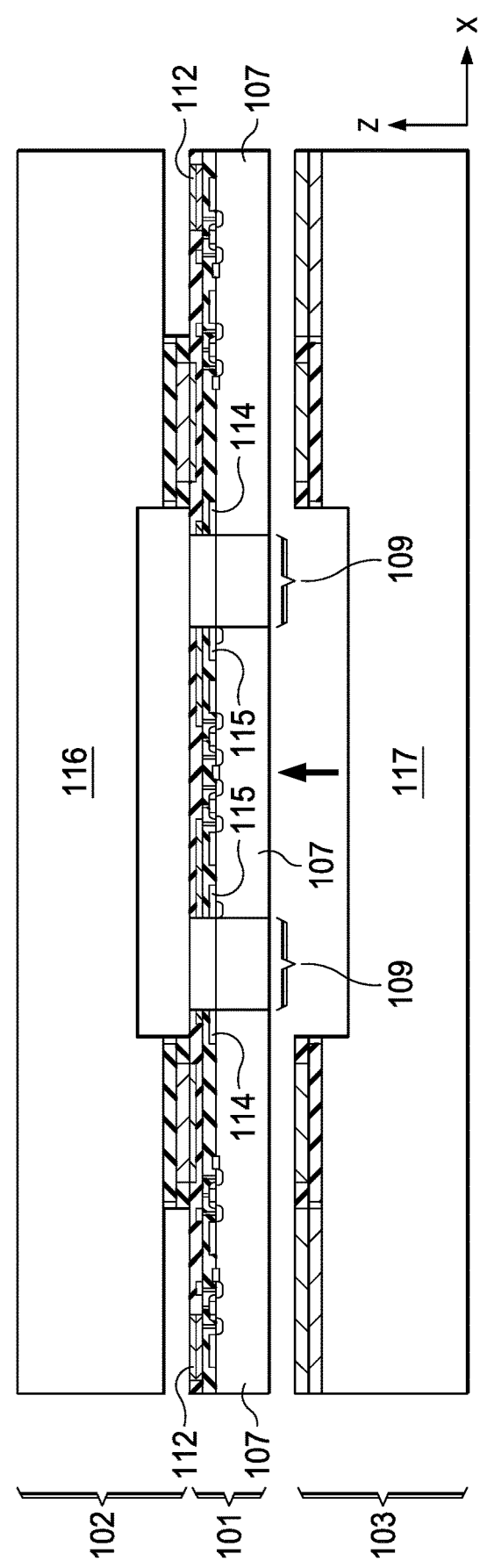
FIGS. 12 and 13 are partial sectional side elevation views of the second surface of the first wafer being bonded to a first surface of the third wafer.
Figure 13:
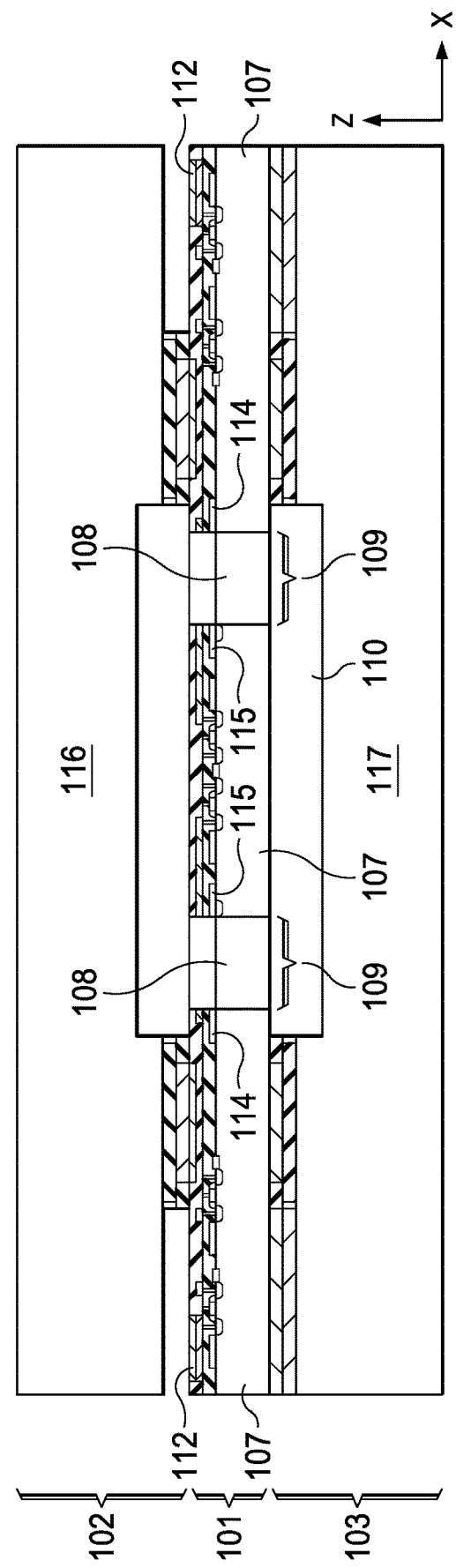

Referring to FIGS. 4 and 11-13, the method 400 further includes processing a third wafer (e.g., wafer 103) to be bonded to the bottom surface of the first wafer 101. As shown in FIG. 11, the method 400 includes forming a cavity or concave region in the third wafer 103. In one example, a selective etch process is performed at 416, which etches a cavity into a first portion of a first surface of the third wafer 103. FIG. 11 shows one example, in which a cavity or recess is etched into the first (e.g., top) surface of the third substrate 117. At 418, the method 400 includes forming an oxide layer on the first surface of the third wafer 103 and/or forming a metallization structure on the first surface of the third wafer 103. FIG. 11 shows one example with a metallization structure formed on the first surface of the third wafer 103 laterally spaced from the etched cavity. FIGS. 12 and 13 show a wafer bonding process performed at 420 in FIG. 4. The bonding processing at 420 bonds the second (e.g., bottom) surface of the first wafer 101 to the first surface of the third wafer 103. The wafer bonding at 420 provides the structure as shown in FIG. 13 with the etched first portion of the third wafer 103 spaced from the first segment 104 of the substrate 107 to complete the sealed cavity 110 that surrounds the first segment 104 with the remaining bridge segments that support the first segment 104 within the sealed cavity 110. In one example, the second wafer bonding process at 420 is performed in a controlled ambient, such as a vacuum, to set the internal conditions of the sealed cavity 110.

Referring to FIGS. 1 and 4, the example method 400 further includes die separation at 422 to singulate individual die areas of the multi-wafer structure into separate dies. In one example, the die separation at 422 includes: backgrinding the second and third wafers 102 and 103 to a desired thickness; and dicing out of the second wafer 102 over the first wafer 101 (e.g., partial dicing without touching the first wafer 101 to expose the wirebond pads), and die singulation. In one example, the second wafer 102 includes at least one cavity, as shown in FIG. 7, that overlies a bond pad (e.g., contact 112) of the first wafer 101 to facilitate silicon removal during partial dicing. The individual dies include: the first wafer 101 with the first and second segments 104 and 106; and one or more openings 109 and one or more bridge segments 108, sandwiched between singulated portions of the second (e.g., upper) wafer 102 and the third (e.g., lower) wafer 103. The method 400 further includes packaging at 424. In the example of FIG. 1, the packaging processing at 424 includes mounting a bottom portion of the third wafer 103 to a leadframe with multiple conductive leads 118. The packaging at 424 further includes soldering individual bond wires 119 between a respective one of the conductive leads 118 and one of the conductive contacts 112 to form electrical connections to the first circuit 105 and/or to the second circuit 111. A plastic package structure 120 is formed, such as by molding, to enclose the first wafer 101, the second wafer 102, and the third wafer 103, to provide the finished microelectronic device (e.g., IC) 100 with portions of the conductive leads 118 extending partially outside the package 120 as shown in FIG. 1.

FIG. 14 shows a sectional top view of another example of the microelectronic device 100 taken along line 3-3 of FIG. 1. This example includes four bridge segments 108 that extend between: generally parallel corresponding surfaces of the outer boundary of the first segment 104; and inner surfaces of the boundary of the second segment 106. This bridge segment configuration is achieved by changing the areas etched to form the openings 109 through the first wafer 101 (e.g., 408 in FIG. 4).

FIG. 15 shows a sectional top view of another example of the microelectronic device 100 taken along line 3-3 of FIG. 1. In this example, the etched openings 109 are set to provide bridge segments 108 and the conductive connections 300 with non-linear shapes. This example provides further damping in the mechanical supporting of the first segment 104 inside the sealed cavity 110.

Modifications are possible in the described embodiments, and other embodiments are possible, within the scope of the claims.

What is claimed is:

1. A microelectronic device, comprising:
   a first die, including:
      a substrate, including:
         a first segment, including a first circuit with at least one active component;
         a second segment, including a second circuit; and
         a bridge segment that joins first portions of the first and second segments of the substrate, the bridge segment including at least one conductive structure that electrically connects the first and second circuits; and
      an opening that extends through the substrate along a first direction from a first surface of the first die to a second surface of the first die, the opening forming a gap between second portions of the first and second segments of the substrate;
   a second die, including a first surface, and a second surface spaced along the first direction from the first surface; the first surface of the second die including: a first portion spaced along the first direction from the first segment of the substrate, and a second portion bonded to the first surface of the first die; and
   a third die, including a first surface, and a second surface spaced along the first direction from the first surface; the first surface of the third die including: a first portion spaced along the first direction from the first segment of the substrate, and a second portion bonded to the second surface of the first die;
   the first segment of the substrate supported by the bridge segment within a sealed cavity formed by the opening of the first die, the first portion of the first surface of the second die, and the first portion of the first surface of the third die.

2. The microelectronic device of claim 1, wherein at least one of the first and second circuits includes a heating component to control a temperature of the first circuit or a temperature of the sealed cavity.

3. The microelectronic device of claim 2, wherein the first circuit includes the heating component to control the temperature of the first circuit.

4. The microelectronic device of claim 1, wherein the substrate includes bridge segments that join the first portions of the first and second segments of the substrate.

5. The microelectronic device of claim 4, wherein at least one of the bridge segments has a non-linear shape.

6. The microelectronic device of claim 1, wherein the first circuit includes a circuit selected from the group consisting of a temperature sensor circuit, a resonator circuit, a clock circuit, a CMOS logic circuit, a voltage reference circuit, an amplifier circuit, an analog to digital converter circuit, and a digital to analog converter circuit.

7. The microelectronic device of claim 1, further comprising:
   a plastic package that encloses the first die, the second die, and the third die;
   conductive leads that extend partially outside the plastic package; and
   bond wires connected between respective ones of the conductive leads and one of the first and second circuits.

8. The microelectronic device of claim 1, wherein the bridge segment has a thickness that is a sum of a thickness of the first die plus a thickness of a metal interconnect on a top of the first die.

9. The microelectronic device of claim 1, wherein the bridge segment has a thickness that is a fraction of a thickness of the first die plus a thickness of a metal interconnect on a top of the first die.

10. The microelectronic device of claim 1, wherein the bridge segment has a thickness that is a thickness of a metal interconnect on a top of the first die.

11. The microelectronic device of claim 1, wherein the bridge segment has a thickness that is a sum of a thickness of a metal interconnect on a top of the first die and a thickness of a polyimide layer formed on the metal interconnect.

12. A method of fabricating a microelectronic device, the method comprising:
   fabricating a first die, including:
      forming a first circuit with at least one active component in a first segment of a substrate;
      forming a second circuit in a second segment of the substrate;
      forming a metallization structure on the substrate, the metallization structure including at least one conductive structure formed over a bridge segment of the substrate to electrically connect the first and second circuits; and
      performing an etch process that forms an opening through the substrate along a first direction from a first surface of the first die to a second surface of the first die to form a gap between portions of the first and second segments of the substrate;
   bonding a first surface of the first die to a first surface of a second die with a first portion of the second die spaced from the first segment of the substrate; and
   bonding a second surface of the first die to a first surface of a third die with a first portion of the second die spaced from the first segment of the substrate to support the first segment of the substrate by the bridge segment in a sealed cavity formed by the opening of the first die, the first portion of the first surface of the second die, and the first portion of the first surface of the third die.

13. The method of claim 12, further comprising:
   performing the etch process to form openings through the substrate to form gaps between the portions of the first and second segments of the substrate.

14. The method of claim 12, further comprising:
   etching a cavity into the first portion of the first surface of the second die before bonding the first surface of the first die to the first surface of the second die; and
   etching a cavity into the first portion of the first surface of the third die before bonding the second surface of the first die to the first surface of the third die.

15. The method of claim 12, further comprising:
   forming an oxide layer on the first surface of the second die before bonding the first surface of the first die to the first surface of the second die; and
   forming an oxide layer on the first surface of the third die before bonding the second surface of the first die to the first surface of the third die.

16. The method of claim 12, further comprising:
   forming a metallization structure on the first surface of the second die before bonding the first surface of the first die to the first surface of the second die; and
   forming a metallization structure on the first surface of the third die before bonding the second surface of the first die to the first surface of the third die.

17. An integrated circuit (IC), comprising:
   a first circuit, including at least one active component positioned in a first segment of a first die;
   a second circuit positioned in a second segment of the first die;
   a second die bonded to a first surface of the first die, including a first cavity with an interior surface spaced from the first segment of the first die; and
   a third die bonded to a second surface of the first die, including a second cavity with an interior surface spaced from the first segment of the first die;
   wherein the first die includes:
      at least one opening that extends between the first and second cavities to separate portions of the first and second segments and to form a sealed cavity that surrounds the first segment;
      a bridge segment that supports the first segment in the sealed cavity; and
      at least one conductive structure that electrically connects the first and second circuits.

18. The IC of claim 17, further comprising:
   a plastic package that encloses the first die, the second die, and the third die;
   conductive leads that extend partially outside the plastic package; and
   bond wires connected between respective ones of the conductive leads and one of the first and second circuits.

19. The IC of claim 17, wherein the first circuit includes the heating component to control the temperature of the first circuit.

20. The IC of claim 17, wherein the bridge segment has a thickness selected from the group consisting of a thickness of a patterned silicon die plus a thickness of a metal interconnect on top, a fraction of the patterned silicon die thickness plus the thickness of the metal interconnect on top, only the thickness of the metal interconnect, and a thickness of the metal interconnect with polyimide.

* * * * *